(12) United States Patent
Huang et al.

(10) Patent No.: US 9,755,048 B2
(45) Date of Patent: Sep. 5, 2017

(54) PATTERNED STRUCTURE OF A SEMICONDUCTOR DEVICE AND A MANUFACTURING METHOD THEREOF

(71) Applicant: UNITED MICROELECTRONICS CORP., Hsin-Chu (TW)

(72) Inventors: Rai-Min Huang, Taipei (TW); I-Ming Tseng, Kaohsiung (TW); Tong-Jyun Huang, Tainan (TW); Kuan-Hsien Li, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 75 days.

(21) Appl. No.: 14/710,602

(22) Filed: May 13, 2015

(65) Prior Publication Data
US 2016/0293726 A1    Oct. 6, 2016

(30) Foreign Application Priority Data

Mar. 31, 2015  (TW) .............. 104110484 A

(51) Int. Cl.
| | | |
|---|---|---|
| *H01L 29/66* | (2006.01) | |
| *H01L 29/06* | (2006.01) | |
| *H01L 21/311* | (2006.01) | |
| *H01L 29/40* | (2006.01) | |
| *H01L 27/088* | (2006.01) | |
| *H01L 21/8234* | (2006.01) | |
| *H01L 21/027* | (2006.01) | |
| *H01L 21/308* | (2006.01) | |

(52) U.S. Cl.
CPC .... *H01L 29/66545* (2013.01); *H01L 21/3086* (2013.01); *H01L 21/823437* (2013.01); *H01L 27/088* (2013.01); *H01L 29/0649* (2013.01); *H01L 29/401* (2013.01); *H01L 29/6656* (2013.01)

(58) Field of Classification Search
CPC ........... H01L 29/0649; H01L 21/76224; H01L 29/6681; H01L 21/0338; H01L 21/3088
See application file for complete search history.

(56) References Cited

U.S. PATENT DOCUMENTS

| | | | |
|---|---|---|---|
| 7,807,578 B2 | 10/2010 | bencher | |
| 8,142,986 B2 | 3/2012 | Sim | |
| 2007/0158755 A1* | 7/2007 | Chang ................. | H01L 27/0921 257/374 |
| 2007/0205443 A1* | 9/2007 | Juengling ......... | H01L 21/76229 257/288 |
| 2009/0053870 A1* | 2/2009 | Pan ................... | H01L 21/28273 438/287 |
| 2013/0187237 A1 | 7/2013 | Yu | |
| 2015/0206885 A1* | 7/2015 | Barth, Jr. .......... | H01L 27/10826 257/301 |

* cited by examiner

*Primary Examiner* — Jesse Y Miyoshi
*Assistant Examiner* — John Bodnar
(74) *Attorney, Agent, or Firm* — Winston Hsu

(57) ABSTRACT

A patterned structure of a semiconductor device includes a substrate, a first feature and a second feature. The first feature and the second feature are disposed on the substrate, and either of which includes a vertical segment and a horizontal segment. There is a distance between the vertical segment of the first feature and the vertical segment of the second feature, and the distance is less than the minimum exposure limits of an exposure apparatus.

10 Claims, 5 Drawing Sheets

PATTERNED STRUCTURE OF A SEMICONDUCTOR DEVICE AND A MANUFACTURING METHOD THEREOF

BACKGROUND OF THE INVENTION

1. Field of the Invention

The present invention relates generally to the field of semiconductor devices, and more particularly to a patterned structure of a semiconductor device and a method of making the same.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET is able to increase the overlapping area between the gate and the fin-shaped structure of the silicon substrate, the channel region can therefore be controlled more effectively. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of the current fin-shaped structures may cause some drawbacks even though the fin-shaped structures are widely adopted in the semiconductor device beyond 20 nm node. For instance, an electrical isolation structure is often disposed between two of the adjacent FinFET devices to electrically isolate these FinFET devices. However, due to the existence of the electrical isolation structure, additional space must be provided between two of the adjacent FinFET devices, which inevitably causes the reduction in the integration of the whole semiconductor device.

Accordingly, there is still a need to provide an improved semiconductor device and a method of making the same.

SUMMARY OF THE INVENTION

A patterned structure of a semiconductor device is provided according to one embodiment of the invention. A patterned structure of a semiconductor device includes a substrate, a first feature and a second feature. The first feature and the second feature are disposed on the substrate, and either of which includes a vertical segment and a horizontal segment. There is a distance between the vertical segment of the first feature and the vertical segment of the second feature, and the distance is less than the minimum exposure limits of an exposure apparatus.

A method of fabricating a patterned structure of a semiconductor device is also disclosed according to another embodiment of the present invention. The method includes the following steps: providing a substrate having a target layer thereon; forming a patterned sacrificial layer on the target layer, wherein the patterned sacrificial layer consists of a plurality of sacrificial features; forming spacers respectively on sidewalls of each of the sacrificial features, wherein all of the spacers are arranged to have a layout pattern; and transferring the layout pattern to the target layer so as to form a first feature and a second feature, wherein the first feature comprises a vertical segment and a horizontal segment, the second feature comprises a vertical segment and a horizontal segment, and a distance between the vertical segment of the first feature and the vertical segment of the second feature is less than a minimum feature size generated by an exposure apparatus.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
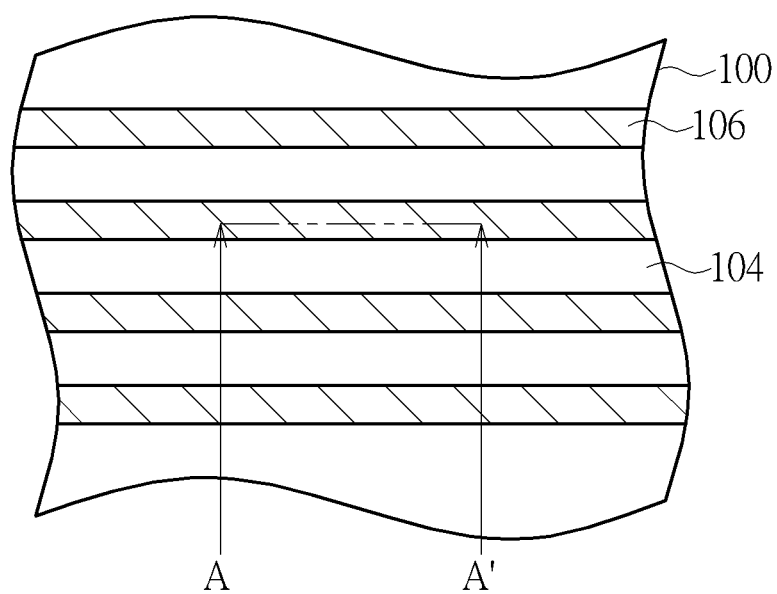
FIG. 1 is a schematic top view showing a structure at the beginning of a fabrication process.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

FIG. 1 is a schematic top view showing a structure at the beginning of a fabrication process. At this stage, a hard mask 104 and a patterned sacrificial layer 106 are disposed on a substrate 100. The patterned sacrificial layer 106 is disposed on the hard mask 104 and has a pattern consisting of several sacrificial features. For example, all of the sacrificial features may be arranged along the same direction, but is not limited thereto.

Figure 2:
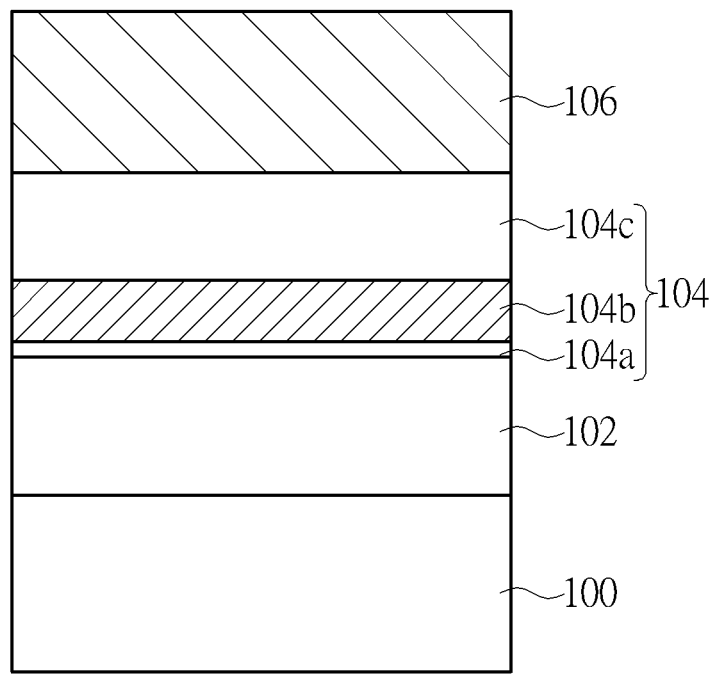
FIG. 2 is a cross-sectional diagram taken along a line A-A' in FIG. 1.

FIG. 2 is a cross-sectional diagram taken along a line A-A' in FIG. 1. In addition to the hard mask 104 and the patterned sacrificial layer 106, there may be other layers disposed on the substrate 100. For example, a target layer with a composition the same as or different from that of the substrate 100 may be disposed between the substrate 100 and the hard mask 104. For the substrate 100 made of single crystalline silicon, the composition of the target layer 102 may be single crystalline or multi-crystalline silicon, silicon germanium or III-V semiconductors with or without dopants. Furthermore, the target layer 102 may also be a metal layer or an isolation layer, but is not limited thereto.

The above-mentioned substrate 100 may be a semiconductor substrate, such as a silicon substrate, a silicon germanium substrate, a silicon-on-insulator (SOI) substrate or the like. The hard mask 104 may be a single-layered or multi-layered structure. For example, when the hard mask 104 is a multi-layered structure, it may include a bottom hard mask 104a, a middle hard mask 104b and a top hard mask 104c stacked from bottom to top. The bottom hard mask 104a, the middle hard mask 104b and the top hard mask 104c may be respectively made of silicon oxide, silicon nitride and silicon oxide, but are not limited thereto. The composition of the patterned sacrificial layer 106 may be chosen from semiconductors such as polysilicon or other suitable materials. The etching rate of the patterned sacrificial layer 106 is preferably different from that of the underlying hard mask 104, especially that of the top hard mask 104c. In this case, because the etching rate of the patterned sacrificial layer 106 is faster than that of the top hard mask 104c, the top hard mask 104c not covered by the patterned sacrificial layer 106 may only be slightly etched during an etching process of forming the patterned sacrificial layer 106.

After the formation of the patterned sacrificial layer 106, a mask layer 110 such as a photoresist layer may be coated onto the surface of the patterned sacrificial layer 106. The mask layer 106 is then patterned by performing a photolithographic process so as to form a suitable pattern such as a rectangular opening in the mask layer 110. In this way, portions of the patterned sacrificial layer 106 may be exposed from the opening of the mask layer 110. Preferably, the dimension of the opening is substantially equal to the minimum feature size, also called the critical dimension (CD), that the corresponding exposure apparatus can print.

Figure 3:
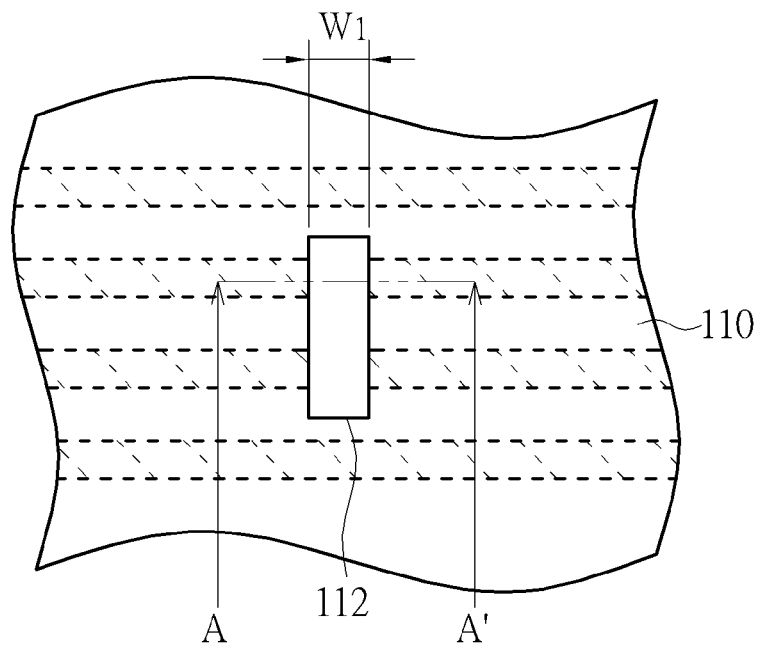
FIG. 3 is a schematic top view showing a structure after removing portions of the patterned sacrificial layer.

FIG. 3 is a schematic top view showing a structure after removing portions of the patterned sacrificial layer. An etching process is then carried out by using the mask layer 110 as an etch mask. During the etching process, the patterned sacrificial layer 106 exposed from the opening 112 may be removed to thereby form an interrupted portion in the patterned sacrificial layer 106. As shown in FIG. 3, the interrupted portion has head-to-head spacing W1.

Figure 4:
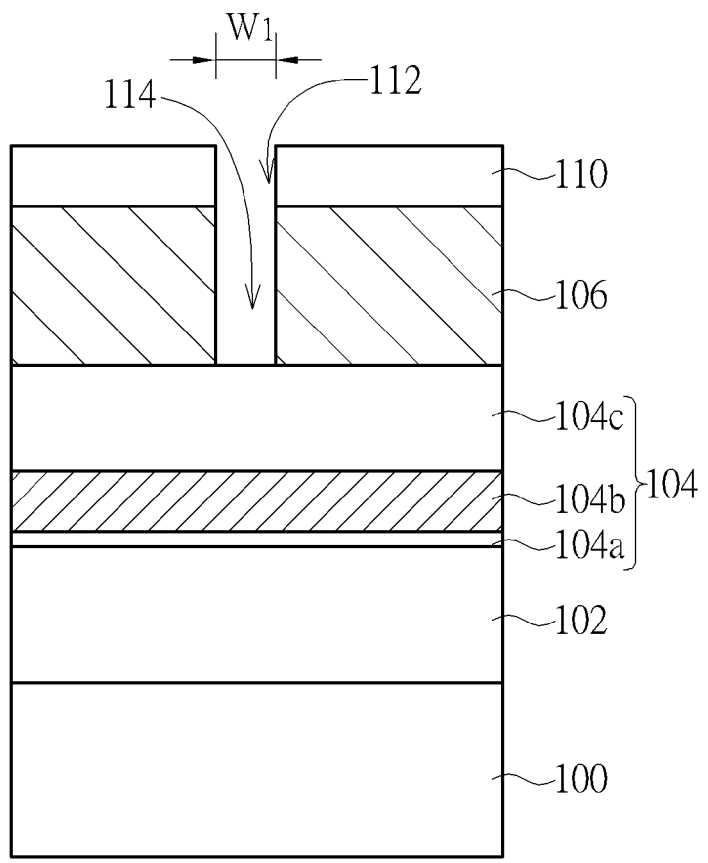
FIG. 4 is a cross-sectional diagram showing a line A-A' taken in FIG. 3.

FIG. 4 is a cross-sectional diagram taken along a line A-A' in FIG. 3. Specifically, because the spacing W1 of the interrupted portion 114 is defined by the dimension of the opening 112, the spacing W1 with a critical dimension that the current exposure apparatus could achieve may be obtained when the dimension of the opening 112 is substantially equal to the critical dimension.

It should be noted that the processes of forming the patterned sacrificial layer 106 and cutting off portions of the patterned sacrificial layer 106 may include at least two photolithography-etch processes. Specifically, the first photolithography-etch process is applied to form strips of the patterned sacrificial layer 106, and the second photolithographic-etching process is applied to cut off portions of the patterned sacrificial layer 106. These processes are also called a photolithography-etch-photolithography-etch (2P2E) process, but are not limited thereto. The patterned sacrificial layer 106 with the interrupted portion may also be fabricated in another way. For example, a single multi-patterning process and a single etching process may be carried out sequentially so as to form the above-mentioned interrupted patterned sacrificial layer 106.

Figure 5:
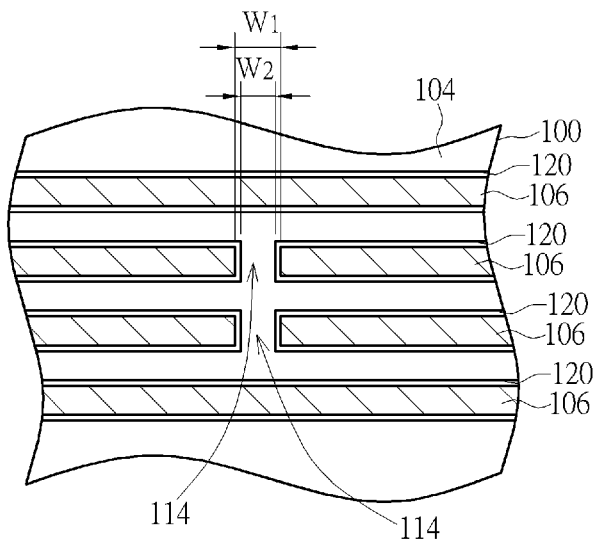
FIG. 5 is a schematic diagram showing a structure after forming spacers on the sidewalls of the patterned sacrificial layer.

FIG. 5 is a schematic diagram showing a structure after forming spacers on the sidewalls of the patterned sacrificial layer. After the removal of the mask layer 110, a thin dielectric layer is conformally formed on the surface of the patterned sacrificial layer 106 and the top surface of the hard mask 104. An anisotropic etching process is then conducted to etch portions of the dielectric layer until required spacers 120 are formed on the sidewalls of the patterned sacrificial layer 106. It should be noted that there is a spacing W2 between two of the adjacent spacers 120, which are disposed corresponding to the location of the interrupted portion 114. As a result, the spacing W2 may be less than the spacing W1. That is to say, the spacing W2 can beyond the minimum feature size that the current exposure apparatus can achieve. Subsequently, the patterned sacrificial layer 106 is removed to leave the spacers 120 on the hard mask 104.

The spacers 120 disclosed above may be made of nitride, oxide, oxynitride or other suitable materials, and the compositions of the spacers 120 are preferably different from those of the patterned sacrificial layer 106 and/or the underlying hard mask 104, especially different from the composition of the top hard mask 104c. Specifically, because the etching rates of the spacers 120, the patterned sacrificial layer 106 and the hard mask 104 are strongly affected by their compositions, by properly adjusting the compositions of these layers, only some of these layers can be completely removed during an etching process. For example, in one case, the patterned sacrificial layer 106 in FIG. 5 may be removed completely during an etching process to expose the underlying hard mask 104, while the spacers 120 are only slightly etched. In another case, the top hard mask 104c (FIG. 4) exposed from the spacers 120 may be completely removed during an etching process, while the spacers 120 are only slightly etched.

Figure 6:
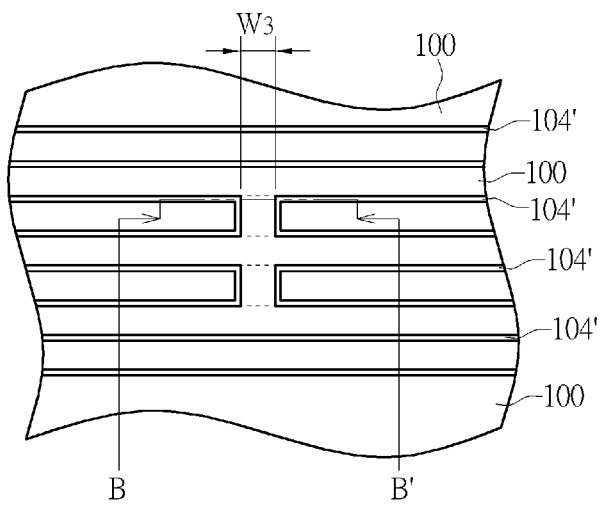
FIG. 6 is a schematic diagram showing a structure after transferring the pattern of the spacers to the hard mask.
Figure 7:
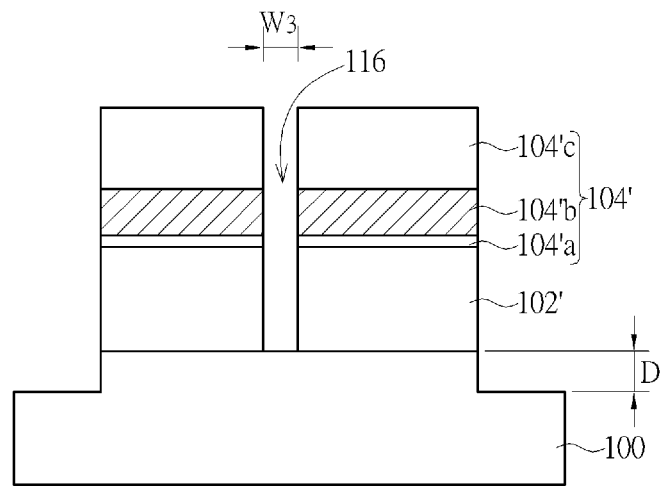
FIG. 7 is a cross-section diagram taken along a line B-B' in FIG. 6.

An image transfer process, such as a sidewall image transfer (SIT) process, is then carried out. During the sidewall image transfer process, the pattern of the spacers 120 is first transferred to the underlying hard mask 104, preferably transferred to the underlying top hard mask 104c. The spacers 120 are then removed to expose the patterned hard mask 104' as shown in FIG. 6, and the pattern of the patterned top hard mask is subsequently transferred to the underlying target layer 102' (FIG. 7) by using the patterned top hard mask as an etch mask. The corresponding structure is shown in FIG. 6 and FIG. 7. FIG. 6 is a schematic diagram showing a structure after transferring the pattern of the spacers 120 to the hard mask 104', and FIG. 7 is a cross-section diagram taken along a line B-B' in FIG. 6. Please refer to FIG. 7, when the image transfer process is completed, the patterned target layer 102', which is composed of an patterned bottom hard mask 104a, a patterned middle hard mask 104'b and a patterned top mask 104'c, may be covered by the patterned hard mask 104'. Because the pattern composed of the patterned target layer 102' and the patterned hard mask 104' is defined by the pattern composed of the spacers 120, the spacing W3 of the patterned target layer 102' may be substantially equal to the spacing W2 of the corresponding spacers 120. In other words, the spacing W3 can be less than the minimum feature size that the current exposure apparatus can achieve. In addition, the depth in the head-to-head region 116 may be shallower than that in other regions, and there is a depth difference D between the head-to-head region 116 and other regions. This feature is resulted from the narrow opening in head-to-head region 116 between two Patterned hard mask 104', which the narrow opening will mitigate the strength of the etching force applied in the image transfer process. A dashed line is shown in FIG. 6 to denote this shallower region. Subsequently, one or more etching processes may be carried out in order to remove unnecessary patterned target layer 102' and unnecessary patterned hard mask 104' from the substrate 100.

Figure 8:
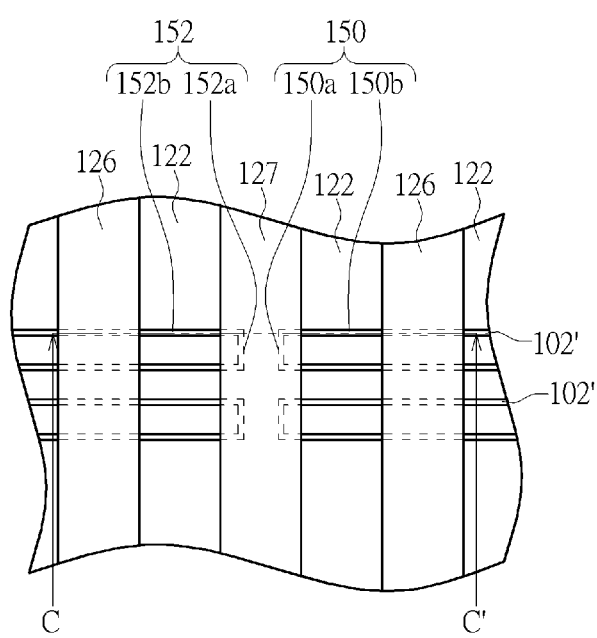
FIG. 8 is a schematic diagram showing a structure after forming an isolation structure and gate structures.

FIG. 8 is a schematic diagram showing a structure after forming an isolation structure and gate structures. After the above-mentioned image transfer process, several fabrication processes may be carried out sequentially in order to fabricate an isolation structure such as a shallow trench isolation (STI) 122. These processes, for example, may include a dielectric deposition process, a dielectric planarization process, and a dielectric etching back process. The patterned mask may also be removed so as to expose the top surface of the patterned target layer 102'. By conducting the above processes, the patterned target layer 102' may include at least two opposite features such as a first feature 150 and a second feature 152. Specifically, both of the first feature 150 and the second feature 152 may include vertical segments 150a and 152a and horizontal segments 150b and 152b. The vertical segments 150a and 152a are arranged in parallel, and the horizontal segments 150b and 152b are also arranged in parallel. Additionally, the vertical segments 150a and 152a may be substantially perpendicular to the horizontal segments 150b and 152b, but are not limited thereto. Subsequently, in order to fabricate a transistor device, gate structures 126 and at least a dummy gate structure 127 may be further fabricated on the isolation structure 122 and the patterned target layer 102'. Portions of the horizontal segments 150b and 152b may be covered by the gate structures 126, while all of the vertical segments 150a and 152a and other portions of the horizontal segments 150b and 152b may be covered by the dummy gate structure 127.

Figure 9:
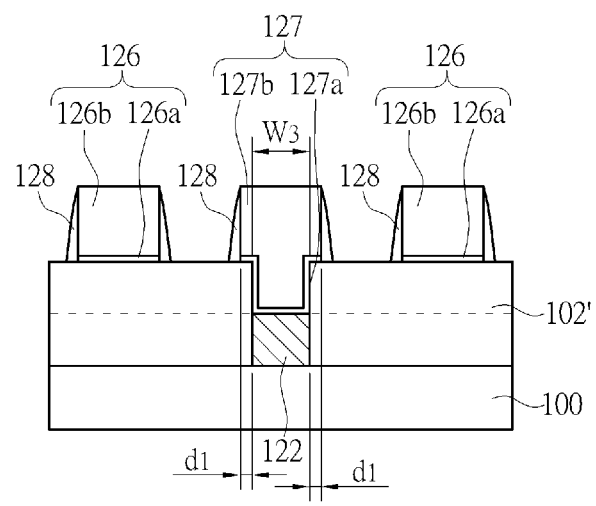
FIG. 9 is a cross-sectional diagram taken along a line C-C' in FIG. 8.

FIG. 9 is a cross-sectional diagram taken along a line C-C' in FIG. 8. In the embodiment shown in FIG. 9, the upper segment of the patterned target layer 102' may protrude from the shallow trench isolation 122, and portions of the sidewalls of the target layer 102' may be in direct contact with the dummy gate structure 127 or further in direct contact with the gate structure 126. The segment protruding from the shallow trench isolation 122 may be called a fin-shaped structure, wherein the dashed line shown in the figure denotes the level of shallow trench isolation 122, and the height of the fin-shaped structure is approximately ranged from 300 Angstroms to 400 Angstroms. It should be noted that portions of the bottom of the dummy gate structure 127 can overlap the end of the patterned target layer 102', and the length of the overlapping region is preferably greater than a predetermined value such as 5 nanometers.

The gate structure 126 described above may include a gate dielectric 126a and a gate electrode 126b, and the sidewalls of the gate structure 126 may be covered by gate spacers 128. The dummy gate structure 127 may include a dummy gate dielectric 127a and a dummy gate electrode 127b, and the sidewalls of the dummy gate structure 127 are also covered by the gate spacers 128. Furthermore, the gate structure 126 and the dummy gate structure 127 may have the same compositions and materials because they are concurrently fabricated. For example, the compositions of the gate dielectric 126a and the dummy gate dielectric 127a may be silicon oxide or high-k dielectric layer, and the compositions of the gate electrode 126b and the dummy gate electrode 127b may be polysilicon or other suitable conductive materials. The composition of the gate spacers 128 may be $SiN_x$, $SiC_x$, $SiCN_x$, $SiNO_x$ or other suitable dielectric materials.

Furthermore, when the above structures are applied in transistors, optional ion-implantation processes may be further carried out before the formation of the gate structure 126 and the dummy gate structure 127 to thereby form doped regions, such as well regions, punch-through stopper regions and so forth, in the patterned target layer 102'. Additionally, other ion-implantation processes may be carried out after the formation of the gate structure 126 and the dummy gate structure 127 to thereby form source/drain regions in the patterned target layer 102', but is not limited thereto. Optionally, epitaxial growth processes and replacement metal gate (RMG) processes may also be carried out after the formation of the gate structure 126 and the dummy gate structure 127.

Figure 10:
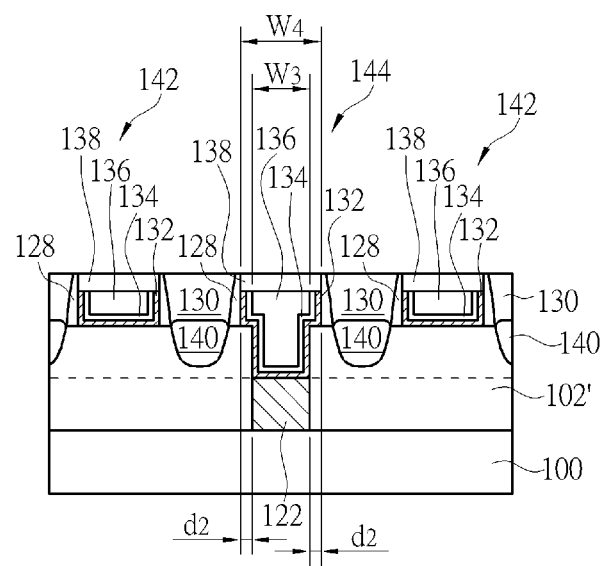
FIG. 10 is a cross-sectional diagram showing a structure after forming epitaxial structures and metal gate structures.

FIG. 10 is a cross-sectional diagram showing a structure after forming epitaxial structures and metal gate structures. When the above epitaxial growth process and the replacement metal gate process are completed, the epitaxial structures 140 are disposed in the patterned target layer 102' on two sides of the gate structures 142 and 144, wherein the dashed line shown in the figure denotes the level of shallow trench isolation 122. The metal gate structures 142 and the dummy metal gate structure 144 are disposed in the interlayer dielectric 130, and their locations can correspond to the locations of the original gate structures and the dummy gate structure. Specifically, each of the gate structures 142 and 144 may include a high-k dielectric layer 132, a work function metal layer 134, a gate electrode 136 and a cap 138. There is a horizontal overlapping area between the bottom of the dummy metal gate structure 144 and the patterned target layer 102', and the distance d2 of the overlapping area is substantially equal to the distance d1 of the overlapping area between the dummy gate structure and the patterned target layer. The distance d2 is preferably greater than a predetermined value, such as 5 nanometers.

Because the spacing of the spacers in the head-to-head region is less than the minimum feature size that the current exposure apparatus can achieve, the spacing W3 of the patterned target layer 102' in the head-to-head region, which is defined by the pattern of the spacers, is also less than the minimum feature size that the current exposure apparatus can achieve. Therefore, the spacing W3 of the patterned target layer 102' can be further reduced. In this way, when the horizontal overlapping area between the dummy gate structure 144 and the patterned target layer 102' is kept in a certain value, the width W4 of the corresponding dummy gate structure 144 the is also reduced.

The material of the high-k dielectric layer 132 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The work function metal layer 134 is formed for tuning the work function of the later formed metal gates to be appropriate in an NMOS or a PMOS. For an NMOS transistor, the work function metal layer 134 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 134 having a work function ranging between 4.8 eV and 5.2 eV may include titanium nitride (TiN), tantalum nitride (TaN), tantalum carbide (TaC), but it is not limited thereto. The gate electrodes 136 may include metal or metal oxide with superior filling ability and relative low resistance, such as aluminum (Al), titanium aluminum (TiAl), titanium aluminum oxide (TiAlO), tungsten (W) or copper (Cu), but not limited thereto. The cap layer 138 may be made of silicon carbon nitride, silicon oxynitride, silicon nitride, silicon carbide or other suitable semiconductor compounds different from the composition of the interlayer dielectric 130. In this way, the ratio of the etching rate of the interlayer dielectric 130 to the etching rate of the cap layer 138 may be greater than a certain value, but is not limited thereto.

After the epitaxial structures 140 and the metal gate structures 142 and 144 are fabricated through the above-mentioned processes, other fabrication processes may be carried out in order to obtain a required device. These fabrication processes may be processes for fabricating pre-metal dielectric (PMD), contact plugs, metal silicide, interconnections and so forth.

Furthermore, although the patterned target layer disclosed above is a part of the FinFET device, it may be used as metal interconnections or gate electrodes as well. For example, when the composition of the target layer is metal, the corresponding patterned target layer may be used as metal interconnections of semiconductor devices, and the metal interconnections can also include the vertical segments and the horizontal segments. In another case where the composition of the target layer is semiconductors, such as polysilicon, the corresponding patterned target layer may be used as gate electrodes of semiconductor devices, and the gate electrodes also include the vertical segments and the horizontal segments.

To summarize, the present invention provides a semiconductor device and a manufacturing method thereof. By forming the spacers on the sidewalls of the patterned sacrificial layer, the spacing between two adjacent spacers in the head-to-head region can be less than the spacing of the interrupted portion in the same region. The spacers can compose a desired pattern which is able to be transferred to the target layer during the subsequent image transfer process. Because the spacing of the spacers in the head-to-head region can be less than the minimum feature size that the current exposure apparatus can print, the corresponding pattern transferred to the target layer in that region can also have a spacing less than the minimum feature size.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A patterned structure of a semiconductor device, comprising:
   a substrate;
   a first fin-shaped feature disposed on the substrate, wherein the first fin-shaped feature comprises a first segment extending in a first direction and a second segment extending in a second direction perpendicular to the first segment, wherein both of the first direction and the second direction are parallel to the substrate;
   a second fin-shaped feature disposed adjacent to the first fin-shaped feature on the substrate, wherein the second fin-shaped feature comprises a third segment extending in the first direction and adjacent to the first segment and a fourth segment extending in the second direction, and a distance between the first segment of the first fin-shaped feature and the third segment of the second fin-shaped feature is less than a minimum feature size generated by an exposure apparatus that produces structures with the minimum feature size; and
   a dummy structure completely overlaps the first segment of the first fin-shaped feature and the third segment of the second fin-shaped feature and partially overlaps the second segment of the first fin-shaped feature and the fourth segment of the second fin-shaped feature.

2. The patterned structure of the semiconductor device of claim 1, wherein the first fin-shaped feature and the second fin-shaped feature are made of metal, single crystalline semiconductor or multi-crystalline semiconductor.

3. The patterned structure of the semiconductor device of claim 1, wherein the first segment of the first fin-shaped feature is parallel to the third segment of the second fin-shaped feature.

4. The patterned structure of the semiconductor device of claim 1, further comprising a shallow trench isolation enclosing lower portions of both the first fin-shaped feature and the second fin-shaped feature, wherein a top surface of the first fin-shaped feature and a top surface of the second fin-shaped feature are higher than a top surface of the shallow trench isolation.

5. The patterned structure of the semiconductor device of claim 1, wherein the dummy structure is a dummy gate structure or a dummy metal gate structure.

6. The patterned structure of the semiconductor device of claim 1, wherein the dummy structure completely overlaps each of the second segments and the fourth segments.

7. The patterned structure of the semiconductor device of claim 1, further comprising spacers disposed on sidewalls of the dummy structure, wherein the spacers cover portions of the first fin-shaped feature and portions of the second fin-shaped feature.

8. The patterned structure of the semiconductor device of claim 1, further comprising a plurality of gate structures covering portions of the second segment of the first fin-shaped feature and portions of the fourth segment of the fin-shaped second feature.

9. The patterned structure of the semiconductor device of claim 1, further comprising a plurality of epitaxial structures respectively disposed in the first fin-shaped feature and the second fin-shaped feature on two sides of the dummy structure.

10. The patterned structure of the semiconductor device of claim 9, wherein the epitaxial structures are spaced apart from the dummy structure.

* * * * *